United States Patent
Yamaguchi et al.

(10) Patent No.: US 6,716,726 B2
(45) Date of Patent: Apr. 6, 2004

(54) THIN FILM SEMICONDUCTOR DEVICE CONTAINING POLYCRYSTALLINE SI—GE ALLOY AND METHOD FOR PRODUCING THEREOF

(75) Inventors: Shinya Yamaguchi, Mitaka (JP); Takeo Shiba, Kodaira (JP); Mutsuko Hatano, Kokubunji (JP); Seong-Kee Park, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/277,140

(22) Filed: Oct. 22, 2002

(65) Prior Publication Data

US 2003/0049892 A1 Mar. 13, 2003

Related U.S. Application Data (62) Division of application No. 09/790,545, filed on Feb. 23, 2001.

(30) Foreign Application Priority Data

Feb. 1, 2001 (JP) .......................................... 2001-25531

(51) Int. Cl.[7] ........................... H01L 21/20; H01L 21/36
(52) U.S. Cl. ...................... 438/487; 438/149; 438/482; 438/488; 438/933
(58) Field of Search .......................... 257/19, 347–354; 438/141, 142, 149, 150, 164, 166, 168, 172, 311, 312, 482–491, 586, 796, 798, 933

(56) References Cited

U.S. PATENT DOCUMENTS 6,228,692 B1 * 5/2001 Tsutsu ......................... 438/164
6,303,963 B1 * 10/2001 Ohtani et al. ............... 257/350
6,426,245 B1 * 7/2002 Kawasaki et al. ........... 438/166
6,506,669 B1 * 1/2003 Kuramasu et al. .......... 438/586

FOREIGN PATENT DOCUMENTS

| JP | 7321339 | 12/1995 |
| JP | 855808 | 2/1996 |
| JP | 1041234 | 2/1998 |

OTHER PUBLICATIONS

Edelman et al., "Crystallization of amorphous Si—Ge films on silica", Thin Solid Films, vol. 222 (1–2), p 57–9 (1992).*
Ukhin et al., "Change in electrical property of single crystals of Ge—Si (Ge1—xSix) solid solutions due to irradiation", Fiz. Tekh. Poluprovodon. (Leningrad), vol. 18 (6), p 981–5(1984).*

(List continued on next page.)

*Primary Examiner*—Evan Pert
*Assistant Examiner*—Asok Kumar Sarkar
(74) *Attorney, Agent, or Firm*—Antonelli, Terry, Stout & Kraus, LLP

(57) ABSTRACT

The present invention relates to a thin film transistor, in a low-temperature poly-Si thin film becoming an elemental material of the thin film transistor, an object of the invention is to provide the thin film transistor suitable for realizing an image display device having a high performance and a large area at low cost by realizing a poly-crystalline thin film having a crystal structure restraining current scattering in a grain boundary, lessening surface roughness, and capable of realizing high mobility even to a positive hole current.

The object described above is achieved by realizing a TFT with high mobility by restraining a current scattering factor in a grain boundary of crystal with an introduction of Ge into the poly-crystalline Si thin film and with a difference in ratios of Ge compositions between an interior grain of crystal and a grain boundary of crystal resulted from a phase separation involved in crystallization, and by restraining surface roughness using a difference in volumes in a crystal.

8 Claims, 12 Drawing Sheets

OTHER PUBLICATIONS

Qian et al., "Growth of Ge—Si/Si heteroepitaxial films by remote plasma chemical vapor deposition", J. Vac. Sci. Technol. A, vol. 10 (4, Pt. 2), p 1920–6 (1992).*

Owusu–Sekyere et al., "Characterization of Si—Ge and Si—Ge—Ga phosphide thermoelements", Mater. Sci. Eng. B, vol. B3 (3), p 231–40 (1989).*

Kim et al., "Effects of germanium on grain size and surface roughness of the solid phase crystallized polycrystalline Si1—xGex films", Mater. Res. Soc. Symp. Proc. (1997).*

Ukhin et al., "Change in Electrical Property of Single Crystals of Ge—Si (Ge1—x—Six) Solid Soluations Due to Irradiation", Fiz. Tekh. Poluprovodon. (Lenigrad), vol. 18 (6), p 981–5 (1984).

Qian et al., "Growth of Ge—Si/Si Heteroepitaxial Films by Remote Plasma Chemical Vapor Deposition", J. Vac. Sci. Technol. A, vol. 10 (4, Pt 2), p 1920–6 (1992).

Owusu–Sekyere et al., "Characterization of Si—Ge and Si—Ge—Ga Phosphide Thermoelements", Mater. Sci. Eng. B, vol. B3(3), p. 231–40 (1989).

Kim et al., "Effects of Germanium on Grain Size and Surface Roughness of the Solid Phase Crystallized Polycrystalline Si1—xGex films", Mater. Res. Soc. Symp. Proc. (1997).

"Physics of Semiconductor Devices" p. 29, $2^{nd}$ Edition.

M.S. Prokes and F. Spaepen, App. Lett., vol. 47, p 234(1985).

K. Nakagawa, N. Sugii, S. Yamaguchi, and M. Miyao, J. Cryst. Growth, vol. 210, p. 560 (1999).

M.V. Fischetti and S.E. Laux, J. Appl. Phys. vol. 80, p 2234, (1996).

Edelman et al., "Crystallization of Amorphous Si—Ge Films on Silica", Thin Solid Films, vol. 222 (1–2), p. 57–9 (1992).

* cited by examiner

FIG. 6
(PRIOR ART)
plan-view SEM image

100 μm

FIG. 7 plan-view SEM image plan-view dark-field TEM image

THIN FILM SEMICONDUCTOR DEVICE CONTAINING POLYCRYSTALLINE SI— GE ALLOY AND METHOD FOR PRODUCING THEREOF

This application is a Rule 53(b) divisional of U.S. Application No. 09/790,545, filed Feb. 23, 2001, the subject matter of which is incorporated herein by reference.

BACKGROUND OF THE INVENTION

Field of the Invention

The present invention relates to thin film transistor devices and methods for producing thereof. More particularly, the present invention relates to a thin film transistor device and a method for producing thereof suitable for a transistor using a poly-crystalline silicon (poly-Si)

Thin film transistor devices are utilized mainly for an image display device of a liquid crystal display device (LCD), a plasma display device (PDP) and the like as pixels or thin film transistors (TFT) for driving a peripheral circuit.

High-temperature poly-crystalline Si has been used for a base thin film employed for forming conventional thin film transistors. Poly-crystalline Si (poly Si) thin film is formed on a quartz substrate (i.e., an insulator substrate) by a high-temperature heat treatment at a temperature below or above 900° C., and the poly-crystalline Si of comparatively large grain size (for example, 500–600 nm) is formed.

A TFT formed on the high-temperature poly-crystalline Si (hereinafter, referred to as high-temperature poly-Si) thin film utilizes a Si thin film having a low density in a grain boundary of the crystal and excellent crystallinity, as a channel, so that a field effect mobility can be obtained of 100–150 $cm^2Ns$, as a value close to conventional type Si-LSi on a Si substrate having ~500 $cm^2Ns$. See S. M. Sze, Physics of Semiconductor Devices, p. 29, Second Edition, Wiley.

However, high-temperature poly-Si uses expensive quartz substrate as the insulator substrate so as to withstand a high temperature process. Since this cost of the substrate has been the main cause of difficulty in cost reduction of the entire semiconductor device, the use of such a TFT has been restricted.

In recent years, rather than the high-temperature poly-Si, research has vigorously been carried out on low-temperature poly-crystalline Si (hereinafter, referred to as low-temperature poly-Si). This poly-crystalline Si crystallized amorphous Si is formed on a low cost glass substrate or a plastic substrate by a plasma CVD method or the like utilizing a zone melting re-crystallization method such as excimer laser annealing. Since the poly-crystalline Si thin film is capable of being formed at low-temperature (~150° C.), there is an advantage that a remarkably inexpensive TFT can be formed.

However, the low-temperature poly-Si up to now is small (~100 nm) in crystal grain size compared with the high-temperature poly-Si. Only poly-crystalline Si with large (~50 nm) surface roughness has been formed.

When crystal grain size is small, there are drawbacks such that a density in the grain boundary of crystal existing in a current path becomes large, and current mobility is lowered through current scattering in the grain boundary thereof.

Further, when the surface roughness is large, a requirement for thickening (~100 nm) a gate insulation film to that amount is generated in order to restrain a gate leakage current. Consequently, since the carrier number induced to the channel by the same gate voltage becomes small, the current mobility is also lowered.

From that reason, in a TFT of a product base utilizing conventional low-temperature poly-Si as an elemental material, the field effect mobility thereof is restrained to a degree of up to 150 $cm^2Ns$ in case of an electron carrier, and is restrained to a degree of up to 50 $cm^2Ns$ in case of positive hole carrier. With a small mobility like this, since elemental performance cannot reach the required elemental performance, there is a drawback that elements capable of being formed on the same glass (or plastic) substrate are restricted.

For example, in the case of the image display device, a pixel circuit part which is comparatively low in required performance, can be formed on glass (or plastic). Other circuits which are higher in the required performances such as a source driver, a gate driver, a shift register, and a peripheral controller, since they cannot be formed on the same substrate, are integrated on a printed circuit board as semi-conductor chips utilizing a conventional Si-LSI art. This printed circuit board is connected with the glass substrate.

With such a method, there have been drawbacks such that in addition to small dimensioning (4 in.–10 in.) in screen size depending upon a dimension where the periphery circuit part is mounted, a remarkable increase in cost occurs for the entire image display device. Further, in a power saving image display device, which is promising for a future market, a TFT is indispensable to conduct CMOS (complementary MOS) forming. For that purpose, the requirement for a further increase in performance with respect to the field effect mobility of a positive hole carder is estimated.

In order to improve these drawbacks, enhancement in performance of a TFT into high level is necessitated by realizing such a polycrystalline thin film and that current scattering in the grain boundary is restrained, and the surface roughness thereof is lessened. In order to high-function the low-temperature poly-Si, various arts have been proposed as exemplified hereinafter.

Among them; for example, an art (for example, Japanese Unexamined Patent Publication H7-321339) is provided for forming poly-crystalline Si having an [111] axis in a current moving direction, by introducing a metal element for selectively promoting an amorphous Si film formed on the insulator substrate into crystallization and by carrying out respective crystal growth in a direction parallel to a substrate. Further, an art (for example, Japanese Unexamined Patent Publication H10-41234) is provided for forming rectangular poly-crystalline Si having a <100>axis in a direction perpendicular to the substrate, and a {220} surface in parallel (or at an angle of 45°) to a beam scanning direction by accurately controlling a shape of a laser beam for annealing and a scanning rate of a laser annealing position; and an art (for example, Japanese Unexamined Patent Publication H8-55808) is provided for forming columnar poly-crystalline Si layers trued up of a crystal orientation by forming a first poly-crystalline Si layer on the substrate, by forming a seed crystal having either of typical orientations ({100}, {110}, and {111}) by anisotropic etching and by forming a second poly-crystalline Si layer thereon and the like.

However, in spite of these numerous trials, a TFT with sufficiently high mobility has not been realized so far.

SUMMARY OF THE INVENTION

The conventional crystallization methods of low-temperature poly-Si thin films are not sufficiently complete.

For example, when either of the maximum grain size, or the surface roughness is taken up, performance of a TFT has not, as yet, met the demand required for a peripheral circuit integrated type liquid crystal display panel. So, these arts cannot sufficiently replace an existing thin film transistor device of low function. Accordingly, it is important to realize an image display device having high performance and a large area with low cost.

Thus, a first object of the present invention is to provide a thin film transistor device being excellent in characteristics in which conventional arts cannot provide by restraining current scattering in the grain boundary of crystal, by decreasing the surface roughness, and by realizing a poly-crystalline thin film having a crystal structure so as to realize high mobility even for a positive carrier. A second object is to provide a production method by which a thin film transistor device can be easily obtained. A third object is to provide an image display device utilizing the thin film transistor device.

In order to achieve the objects described above and as a result of various experiments and investigations about low-temperature poly-Si for forming a TFT, the inventors have realized a TFT with high mobility by introducing Ge into a poly-Si thin film, by differentiating (for further details, a ratio of Ge composition in a grain boundary of crystal is made larger than a portion where a ratio of Ge composition in an interior grain is the minimum) a ratio of Ge composition between a crystal interior grain and the grain boundary by a phase separation involved in crystallization, by restraining a current scattering factor in a grain boundary, and by restraining surface roughness utilizing a difference of volumes of a crystal.

The present invention has been carried out based on this knowledge. The first object can be achieved by a thin film transistor device including an insulator substrate, a poly-crystalline thin film formed on the insulator substrate, and a transistor composed of a source, a drain, a channel, and a gate, formed on the poly-crystalline thin film. The poly-crystalline thin film in a channel part of the transistor is composed of a silicon germanium poly-crystal $Si_{1-x}Ge_x$ having a Ge concentration x of 0<x<1, and a Ge concentration x in the poly-crystalline thin film is larger in a grain boundary than a portion where a Ge concentration in an interior grain of crystal becomes the minimum.

Further, preferably, a thickness of the poly-crystalline thin film is 10–100 nm, a Ge concentration x in a central part of a crystal grain constituting the poly-crystalline thin film is $0<x \leq 0.3$, a Ge concentration x in a grain boundary is $0.1<x \leq 1.0$ where the Ge concentration x described above is invariably larger in a grain boundary than a portion where a Ge concentration in an interior grain becomes the minimum.

Further preferable characteristics of a thin film transistor device will be described hereinafter.

In the thin film transistor device, a poly-crystalline $Si_{1-x}Ge_x$ thin film is characterized in that a surface roughness in a grain boundary is equal to or less than 30 nm.

In the thin film transistor device, a main current carried in a channel part of the transistor is characterized as a positive hole.

The thin film transistor device has an insulator substrate, a poly-crystalline thin film formed on the insulator substrate, and a transistor composed of a source, a drain, a channel, and a gate. The poly-crystalline thin film in a channel part of the transistor is characterized by having a {110}-oriented crystal grain in parallel with the substrate and is characterized in that an average lattice constant in a grain boundary is larger than an average lattice constant in an interior grain part of the crystal.

The thin film transistor device is characterized by retaining the insulator substrate, a poly-crystalline $Si_{1-x}Ge_x$ thin film formed on the insulator substrate having a Ge concentration x of 0<x<1. A circuit part is constituted by integrating a plurality of transistors composed of sources, drains, channels, and gates formed on the poly-crystalline $Si_{1-x}Ge_x$ thin film. The circuit part includes a CMOS type transistor such as both a p type transistor and an n type transistor.

Further, the thin film transistor device is characterized in that a Ge concentration of the p type transistor constituting the circuit part is larger than a Ge concentration of the n type transistor.

The second object is achieved by a method for producing a thin film transistor device characterized by having a step for forming an amorphous $Si_{1-x}Ge_x$ layer of a film thickness of 10–100 nm having a Ge concentration x of 0<x<1. An annealing step for crystallizing the amorphous $Si_{1-x}Ge_x$ layer is provided by means of an excimer laser having an energy density of 200–300 mJ/cm$^2$ and a pulse number of 1–50 shots.

Further, preferably, in the method for producing a thin film transistor device, the annealing step is characterized by varying an energy density as (180+T)~(200+T) mJ/cm$^2$ corresponding to a film thickness when the film thickness of the amorphous $Si_{1-x}Ge_x$ layer is set at T nm.

The third object is achieved by an image display device, wherein the image display device has an image display part, an image display circuit controlling a display of the image display part and including at least a data driver, a gate driver, and a buffer amplifier. The image display device may also include a peripheral circuit part positioned in the neighborhood of the image display circuit and controlling the image display circuit. The image display circuit and the peripheral circuit part are integrated on the same substrate as the substrate constituting the image display device. The image display circuit and the peripheral circuit part further retain an insulator substrate, a poly-crystalline $Si_{1-x}Ge_x$ thin film formed on the insulator substrate having a Ge concentration x of 0<x<1, and a circuit part constituted by integrating a plurality of transistors composed of sources, drains, channels, and gates formed on the poly-crystalline $Si_{1-x}Ge_x$ thin film. The circuit part includes a CMOS type transistor such as either one or both of a p type transistor and/or an n type transistor.

Further, preferably, the image display device is characterized in that Ge concentration x of a p type transistor is larger than a Ge concentration x of an n type transistor.

Furthermore preferably, it is characterized in that the circuit part retains positioning marks provided in the neighborhood of these circuits in order to differentiate the p type transistor, the n type transistor, and the CMOS type transistor.

As explained above, according to the present invention, a high mobility TFT is realized by restraining a current scattering factor in a grain boundary of crystal by introducing Ge into Si and a differential of Ge concentrations between an interior grain and a grain boundary of crystal resulting from a phase separation accompanied with crystallization, and by restraining surface roughness with the use of a difference in volumes of a crystal. As a result, large area (for example, equal to or more than 15 inches) image display devices can be highly integrated since pixel matrices and peripheral circuits are capable of being intensively formed on the same glass substrate.

DETAILED DESCRIPTION OF PREFERRED EMBODIMENTS

Hereinafter, characteristics of a crystal growth SiGe according to the present invention will be explained in detail and in comparison with prior art shown in reference to FIG. 6–FIG. 12. In the present specification, a crystallographically equivalent crystal orientation group such as crystal orientations (110), (101), and (011) are summarized and are represented as {111}.

Figure 6:
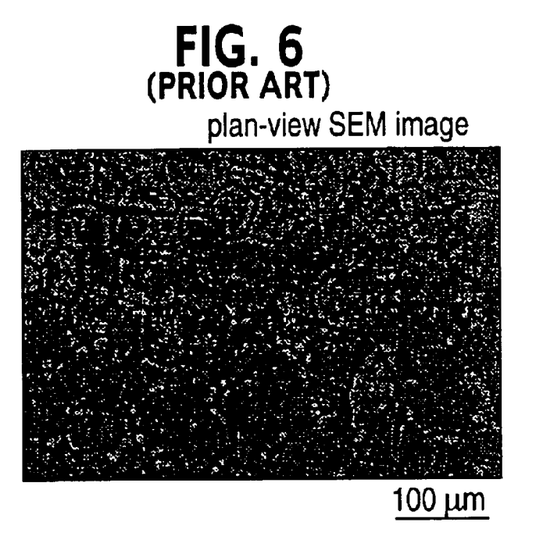
FIG. 6 shows a surface SEM (scanning electron microscope) image of a poly-crystalline Si thin film formed by excimer laser annealing for a base material of the TFT.

FIG. 6 shows prior art of a surface SEM (scanning electron microscope) image of a poly-crystalline Si thin film formed by eximer laser annealing for a base material of the TFT.

In this poly-crystalline Si thin film, a film is formed on a glass substrate with a thickness of 50 nm by a well-known plasma CVD method, and the film is then annealed by an excimer laser under the conditions of an energy density of 340 mJ/cm$^2$.

Although an example having a relatively small size of 50–100 nm is described as an average grain size of low-temperature poly-Si, the maximum grain size that can be achieved at present is 200–300 nm. However, the greater the grain size, the more increase the dispersion of the grain size. As a result, there is a drawback that a large dispersion is generated in TFT mobility.

Therefore, as a practical grain size, the size of 50–100 nm is a typical example. Although grain boundaries of respective crystal grains show dark contrasts, adjacent portions thereto can sporadically observed as a plurality of bright contrast regions. A difference in the contrast such as this corresponds to surface roughness.

A heat treatment method such as the excimer laser annealing involves volume expansion of a Si crystal in processes from melting to solidifying. Therefore, in the vicinity of grain boundaries where respective crystal grains bump against each other, a force uplift of the film in an upper direction perpendicular to a substrate is created in order to expand the volume portions. This force is further enlarged in the vicinity of a triple point in grain boundaries of crystals and constitutes a cause of surface roughness. An average surface roughness reaches 50 nm relative to a Si-poly crystal with a film thickness of 50 nm.

Figure 7:
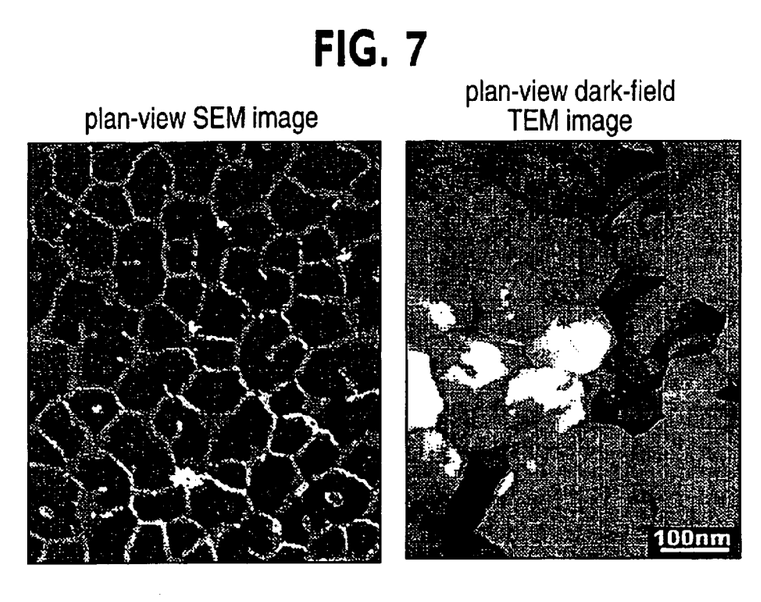
FIG. 7 shows a surface SEM image (left figure) and a plane TEN (transmission electron microscope) image of a poly-crystalline SiGe thin film of the present invention.

FIG. 7 shows a surface SEM image (left figure) and a plane TEM (transmission electron microscope) image of a low-temperature poly-crystalline $Si_{1-x}Ge_x$ thin film according to the present invention. The film is formed by 30 shots of pulsed laser beam under conditions that the Ge concentration x is x=0.3, and an energy density of KrF excimer laser is 240 mJ/cm$^2$.

In this case also, the film having a thickness of 50 nm is formed on a glass substrate by a well known plasma CVD method. At that time, 30 mol % of Ge is introduced as a source relative to Si into CVD gas, and a $Si_{0.7}Ge_{0.3}$ thin film (hereinafter simply refer to SiGe thin film) is formed. That film is annealed by the excimer laser having an energy density of 240 mJ/cm$^2$.

When the left-side figure in FIG. 7 is observed, it will be understood that although crystal grain size is substantially similar to crystal grain size of a poly-crystalline Si thin film in FIG. 6, a contrast relationship between an interior grain and a grain boundary is reversed. In contrast to FIG. 6, this is because a portion of the grain boundary is projected upward more than a portion of the interior grain. As a result of elementary analysis, a remarkably higher concentration of Ge is detected in the grain boundary as compared with the interior grain. The high concentration region approximately coincides with the bright contrast region in FIG. 7.

When a dark field image (right figure in FIG. 7) of plane TEN of poly-crystalline $Si_{0.7}Ge_{0.3}$ thin film is observed, details of a crystal structure can be determined. In this figure (right figure in FIG. 7), measurements are conducted under the condition that a {110} surface in parallel with a surface of substrate is brightly displayed. From the figure it will be understood that most of the crystal grains are similar in brightness to each other, and several black grains exist between the crystal grains. In an interior grain of the crystal, rectilinear patterns are observed at several places. These patterns may be considered stacking faults or twin crystals. The other portions thereof are constituted of substantially beautiful single crystals.

Figure 8:
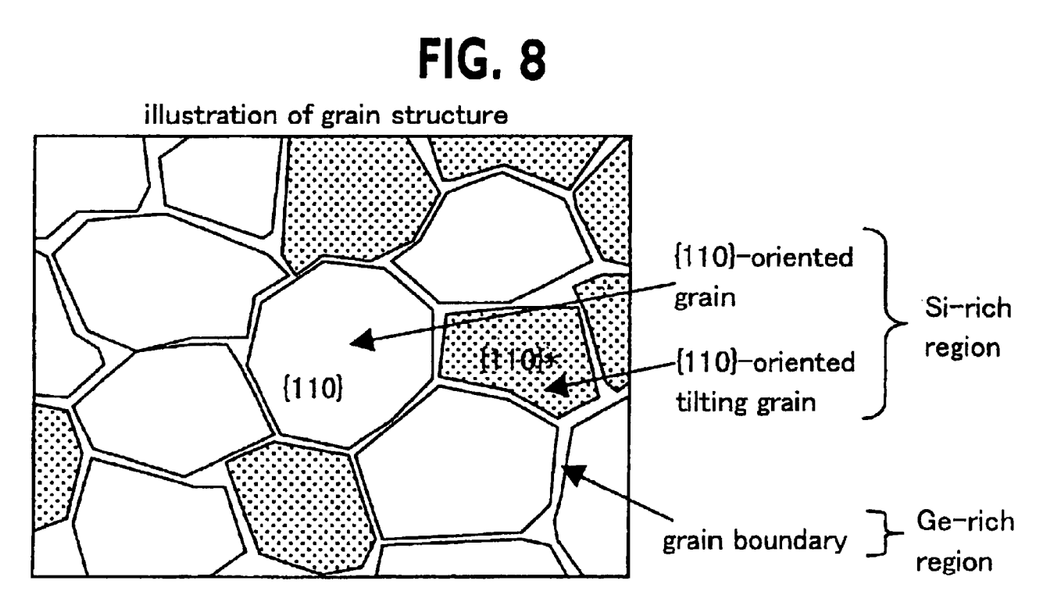
FIG. 8 shows a view illustrating a crystal structure of a poly-crystalline SiGe thin film of the present invention.

FIG. 8 shows a view illustrating a crystal structure of a poly-crystalline SiGe thin film of the present invention illustrated in FIG. 7. Most of the crystal grains have {110} surfaces in parallel to the substrate and trued up one another. Several number of grains having different crystal orientations exist between the crystal grains. These grains having different crystal orientations may have the {110} surfaces inclined at an angle of 1–10° from a surface in parallel to the substrate. Thereby, it will be understood that the poly-crystalline SiGe thin film of the present invention is the poly-crystal having basically a {110} surface orientation.

The interior grain is more Si-rich than a Ge concentration which has been introduced before annealing, and the grain boundaries are constituted of crystals having larger Ge concentrations.

The cause for occurrence of a phase separation (a Ge concentration is different between crystal interior grain and grain boundary) like this results from a diffusion coefficient of Ge in Si and bonding energy of Si versus Ge. The diffusion coefficient of Ge in amorphous Si is comparatively large and $D=8.0\times10^{20}$ cm$^2$/s even at temperature of 600° C. See S. M. Prokes and F. Spaepen, Appl. Phys. Lett., vol 47, p 234 (1985).

Under a mobility condition like this, in order that a crystal assemble a stable lattice, it is better to minimize the bonding energy between respective atoms. The bonding energy between Si-Si, Si-Ge, and Ge-Ge are respectively 3.73 eV, 3.65 eV, and 3.56 eV. See K. Nakagawa, N. Sugii, S. Yamaguchi, and M. Miyao, J. Cryst, Growth, vol. 210, p560 (1999).

Therefore, Ge is energetically stable bonded together to Ge rather than bonded to Si. When a condition is set that there is more Si than Ge before annealing, a Si crystal nucleus is produced in a certain optional position at the initial stage of crystallization. In a growth process thereof, a crystal grain involves many Si performing a growth while expelling Ge to a periphery thereof. It is believed that a poly-crystalline SiGe having such a crystal structure is formed by attaining a growth everywhere of the crystal grains like this.

The phase separation between elements composed of such a plurality of sorts thereof is known. There is an example (for example, Japanese Unexamined Patent Publication H2000–261043) that a poly-crystalline thin film is utilized as a thermo-electric conversion material by cutting and separating phase separated elements respectively to p type/n type. However, the poly-crystalline SiGe thin film in which structures in every portions of the grain boundaries thereof are constituted of their perfectly Ge-rich state such as a poly-crystalline Si thin film of the present invention, the surface roughness in the grain boundary thereof can be restrained as described below, and which can be applied to a TFT. This has not been previously known.

Further, when the phase of Ge-rich like this can be produced, in particular, the perfect state thereof constitutes an advantageous structure to positive hole mobility. A single crystal Ge (electron mobility ~3000 cm$^2$Ns, positive fault mobility ~1500 cm$^2$Ns) as a property of a material itself has a larger mobility than a single crystal Si (electron mobility ~1500 cm$^2$Ns and positive hole mobility ~500 cm$^2$Ns). See M. V. Fischetti and S. E. Laux, J. Apple. Phys. Vol 80, p2234, (1996).

A problem of interface stability of Ge-oxidation film is not so much a problem if a thermal oxidation film is not used but rather a deposit oxidation film is used. One reason why Ge having such a high potential has not been utilized to a TFT is that Ge cannot be practically applied since the grain size of poly-crystalline Ge capable of being formed is remarkably small and the current scattering in a grain boundary is large. However, if the material has a poly-crystalline SiGe thin film structure like the present invention, there is such an advantage that, as a whole, high mobility can be realized by making grain size thereof equivalent to poly-crystalline thin film, and by existing Ge-rich phases of high mobility in the vicinity of grain boundary having large current scattering.

Figure 9:
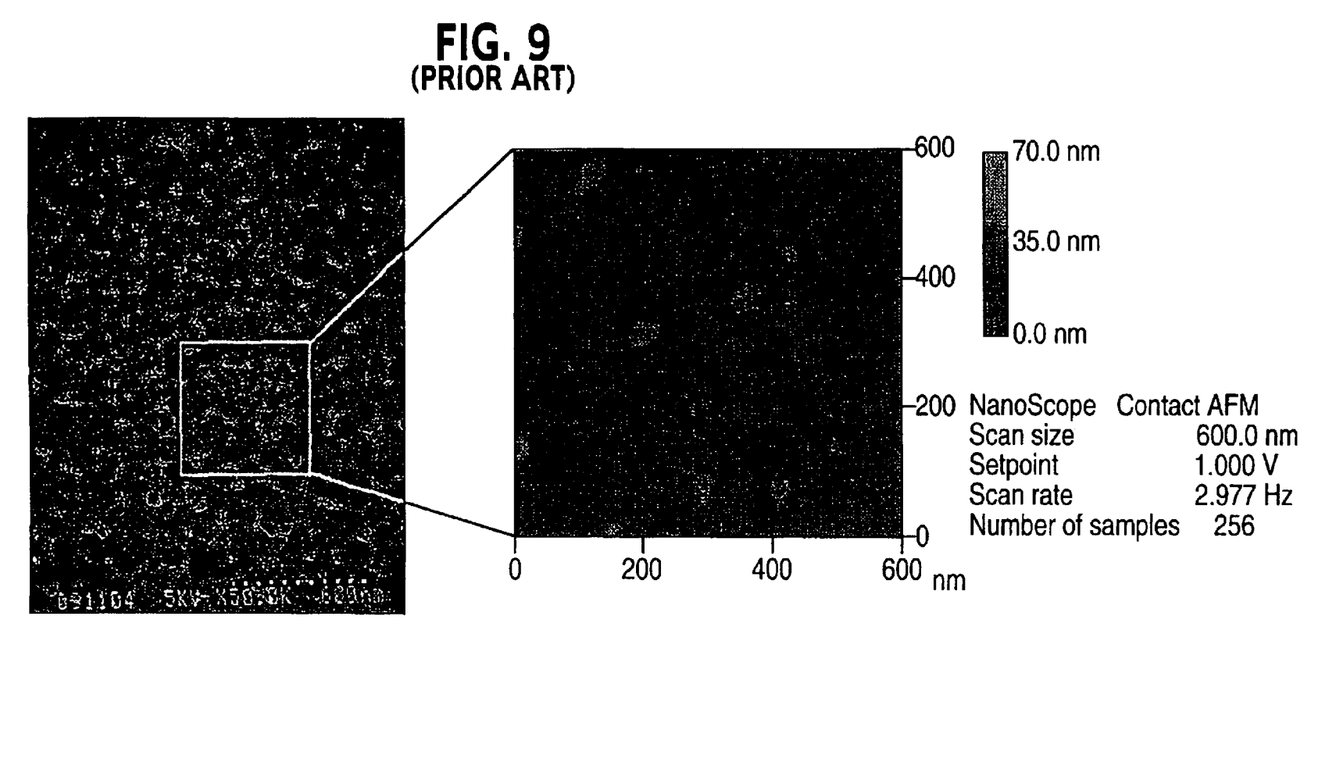
FIG. 9 shows a surface SEM image (left figure) and an AFM (atomic force microscope) image (right figure) for a squarely enclosed region in the left figure of a poly-crystalline Si thin film.

FIG. 9 shows prior art of a surface SEM image (left figure) and an AFM (atomic force microscope) image (right figure) for a squarely enclosed region in the left figure of a poly-crystalline Si thin film. The AFM image displays the surface roughness directly with a ratio of contrast as it is. Bright projection parts are observed everywhere in the vicinity of the triple points of crystal grains in a poly-crystalline Si thin film. A difference of elevation between a top-most point of these projection parts and a bottom-most point of recess parts is about 50 nm as described above and is remarkably large. This means that the force facing upward operated by volume expansion is remarkably large at the triple point.

Figure 10:
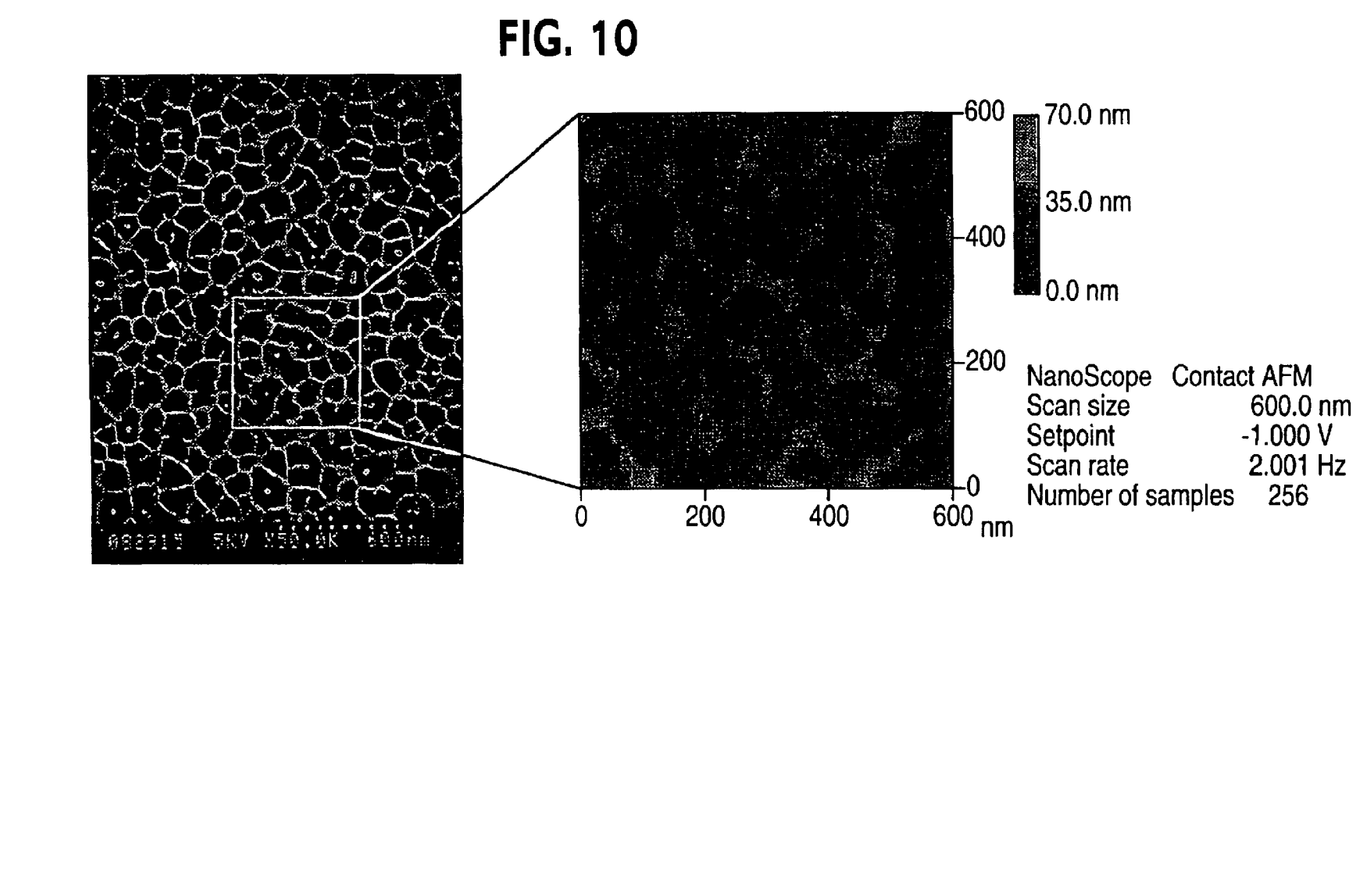
FIG. 10 shows a SEM image (left figure) and an AFM image (right figure) for a squarely enclosed region in the left figure of a poly-crystalline SiGe thin film of the present invention.

On the other hand, FIG. 10 shows a SEM image (left figure) and an AFM image (right figure) for a squarely enclosed region in the left figure of a poly-crystalline SiGe thin film of the present invention. As clearly understood from the AFM image, portions corresponding to grain boundaries are bright, and the projection parts are formed in those portions.

Figure 11:
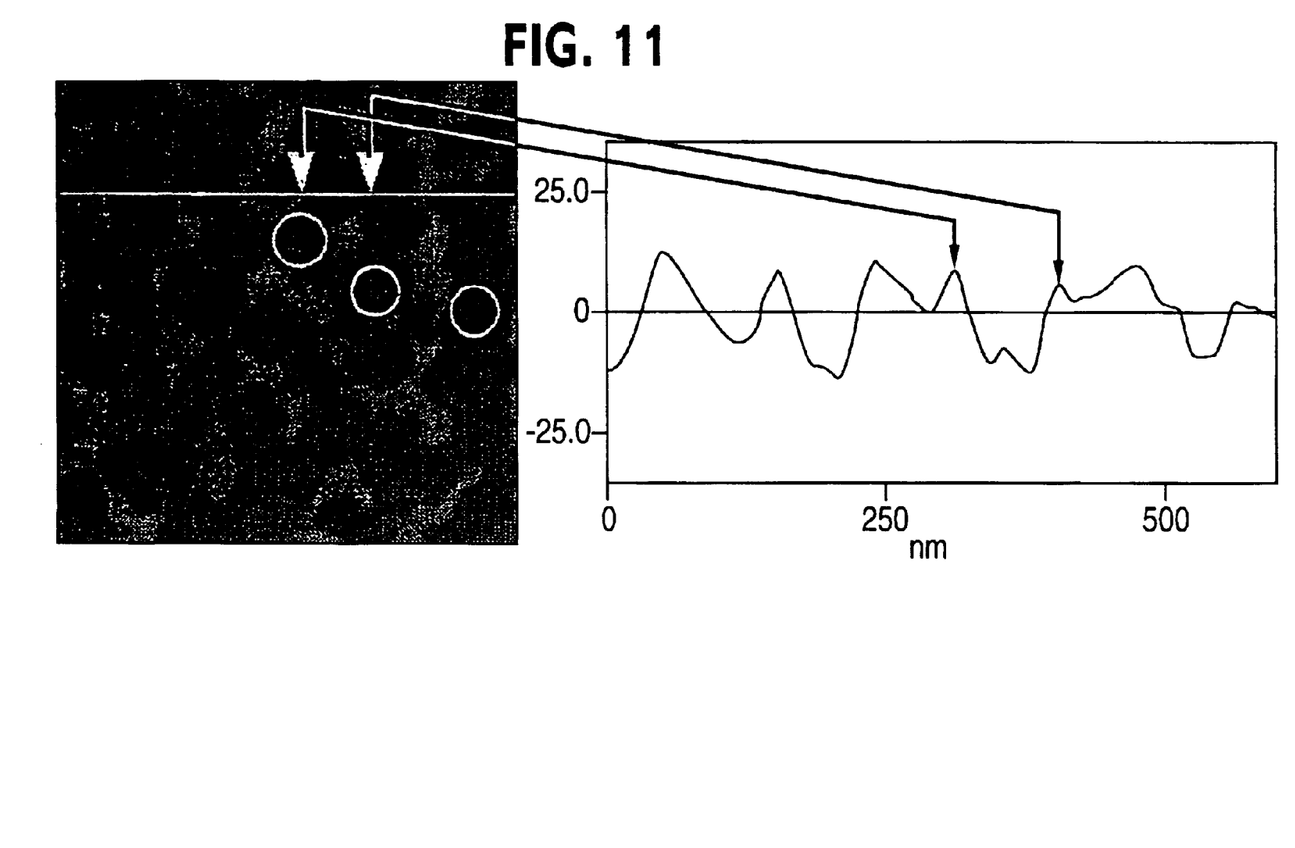
FIG. 11 shows an AFM image (left figure) from FIG. 10 and a view illustrating a distribution of elevations sectioned at a straight line portion drawn in the left figure.

The left figure in FIG. 11 is an AFM image similar to the right figure of FIG. 10. The right figure in FIG. 11 shows a view illustrating a distribution of elevations sectioned at a straight line portion drawn in the left figure. From this figure it will be clearly understood that bright portions correspond to the projection parts and dark portions correspond to the recess parts. Differences of elevations between the top-most point of the projection parts and the bottom-most point of recessed parts are a maximum of 20 nm or so and are remarkably restrained as will be understood by comparing it with 50 nm of the poly-crystalline Si thin film illustrated in FIG. 7.

Differences in coefficients of volume expansion or moduli of elasticity between Si and Ge are considered to be the main cause of the remarkable difference in the elevation. That is, a thin film is formed by a lattice constant (larger than amorphous Si) as mixed crystals of amorphous SiGe before annealing. However, since a soft Ge-rich phase is formed around a comparatively hard Si crystal by a phase separation at the time of solidification, the grain boundary causes a relaxation of volume expansion portion. As a result, the surface roughness can be restrained. Anyway, a poly-crystalline SiGe thin film of the present invention provides unusually smaller surface roughness as compared with a conventional poly-crystalline Si thin film.

Figure 12:
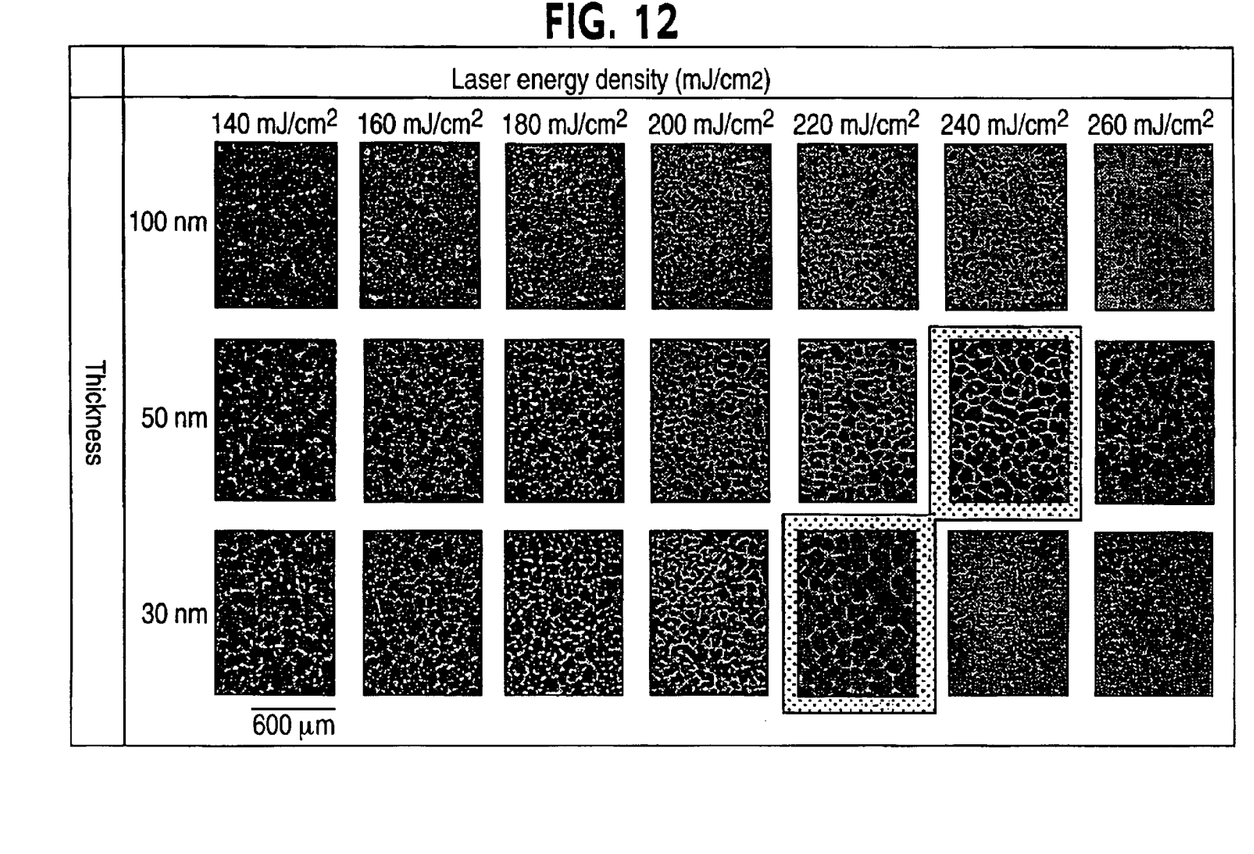
FIG. 12 shows views illustrating laser annealing conditions required for forming a poly-crystalline $Si_{1-x}Ge_x$ thin film of the present invention having a Ge concentration x of x=0.3.

FIG. 12 shows views illustrating laser annealing conditions required for forming a poly-crystalline SiGe thin film of the present invention having a Ge concentration x of x=0.3. An abscissa shows an energy density [mJ/cm$^2$] of excimer (Krf) laser, an ordinate shows a film thickness of a poly-crystalline SiGe thin film, and frequencies of all laser beam annealing of 30 times. When the energy density is gradually increased from the minimum of 140 of mJ/cm$^2$, bright contrast regions showing surface projection parts are gradually increased.

Only in the case of the film thickness being 50 nm and 30 nm, and the energy densities of 240 mJ/cm$^2$, and 220 mJ/cm$^2$, respectively, are projection parts peculiarly coincided with the structure of the crystal grain boundaries. Structures like this can be observed in other Ge concentrations (for example x=0.1 or the like). It has been clear that only under very narrow annealing conditions can the coincidence be realized. This results from a condition under which Ge concentration introduced before annealing become timely in a segregable condition in the solidification process is not so much wide. However, in the present invention, a poly-crystalline SiGe thin film which has been realized under condition of these peculiar annealing treatment is effectively utilized.

Hereinafter, embodiments of the present invention will now be explained. Embodiments of the present invention will be specifically explained with reference to FIG. 1 to FIG. 5.

First Embodiment

Figure 1:
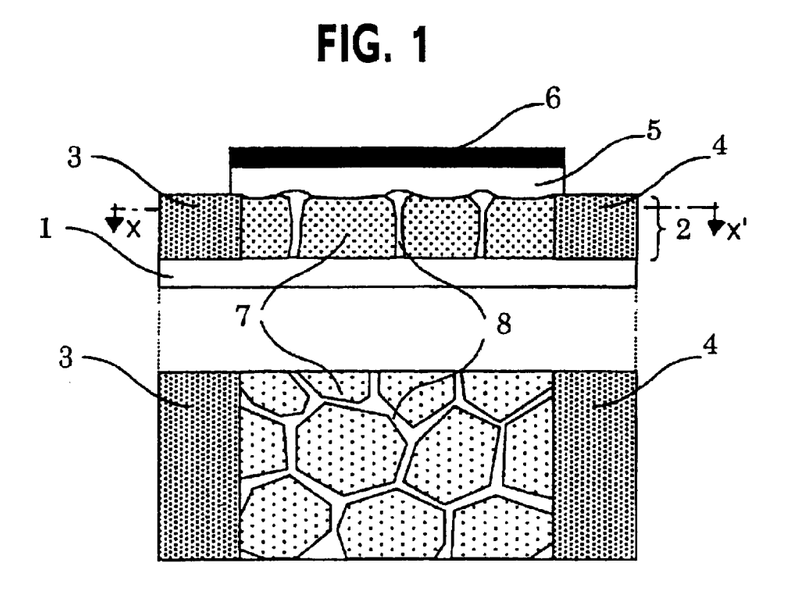
FIG. 1 shows a thin film transistor device relating to a first embodiment of the present invention. In the drawing, a figure in an upper part of FIG. 1 shows a longitudinal sectional view, a figure in a lower part thereof shows a plan view transversely cross sectioning a channel portion.

FIG. 1 shows a thin film transistor device relating to a first embodiment of the present invention. In the drawing, a figure in an upper part of FIG. 1 shows a longitudinal sectional view, a figure in a lower part thereof shows a plan view transversely (taken on line X–X') cross sectioning a channel portion. A poly-crystalline $Si_{1-x}Ge_x$ thin film is formed on the insulator substrate 1 composed of a glass plate under a condition of forming the film by plasma CVD as described below, and under a laser annealing condition.

That is, silane and germane are utilized as raw material gas, while a gas volume is adjusted for obtaining a flow ratio between Si versus Ge of 0.7 versus 0.3. An amorphous $Si_{1-x}Ge_x$ thin film is formed by the plasma CVD to obtain the total film thickness of 50 nm.

Next, a poly-crystalline $Si_{1-x}Ge_x$ thin film 2 is formed by irradiating an excimer laser with respect to a surface of the substrate 1. The laser annealing may be provided under conditions of an energy density of 240 mJ/cm$^2$, the number of pulsed laser beam of 30 shots, and a pulse frequency of 100 Hz.

A source 3 and a drain 4 are formed on this poly-crystalline $Si_{1-x}Ge_x$ thin film, and a gate insulation film 5 and a gate 6 are formed on a channel. The region directly below the gate insulation film 5 is an active region of an electric field effect transistor, so that a current density is the largest. A plan view of that portion is shown in the lower part of FIG. 1. In the present embodiment, the Ge concentration x in an interior of a crystal grain 7 of the poly-crystalline $Si_{1-x}Ge_x$ thin film on this plane is set to be $0<x\leq0.1$ where a Ge concentration x in a grain boundary of the crystal 8 is set to be $0.3\leq x<1$.

With such a lattice structure, a difference in elevations between surfaces (projection parts) of grain boundaries 8 and surfaces (recessed parts) of crystal grains 7 is about 20 nm and the difference is remarkably restrained so that a gate insulation film can be made comparatively thin (~50 nm). Therefore, high mobility can be realized since a number of carriers can be induced to the channel by a relatively small gate voltage.

Further, since most of the crystal grains 7 are trued up to a {110} surface in parallel to the substrate 1, a lattice conformity in crystal grain boundaries is relatively tidy, so that it has an effect that current scattering in grain boundaries can be restrained. The present embodiment further improves mobility of entire films by forming a Ge-rich phase of high mobility in the grain boundaries 8.

Measurement of a Ge concentration x with respect to Si in a poly-crystalline $Si_{1-x}Ge_x$ thin film is conducted by the following methods.

Concentrations of Si and Ge are measured by using a small (about 100 nm) electron beam for a probe of an X-ray micro-analyzer equipped in an interior of a transmission electron microscope (TEM), irradiating surfaces of a sample, and by measuring a wave length and intensity of a characteristic X-ray emitted from a laser irradiation region.

Next, a Ge concentration x relative to Si is found by calculation using the results of measurement for the concentrations of Si and Ge.

Further, the measurement of a concentration of composition for crystal grain is conducted so that a laser beam irradiation region is contained in an interior of a crystal grain. Measurement of a concentration of composition at a grain boundary is conducted so that a laser beam irradiation region includes a grain boundary. Here, the laser beam irradiation region may protrude from the grain boundary and may stride over the crystal grains.

Second Embodiment

Figure 2:
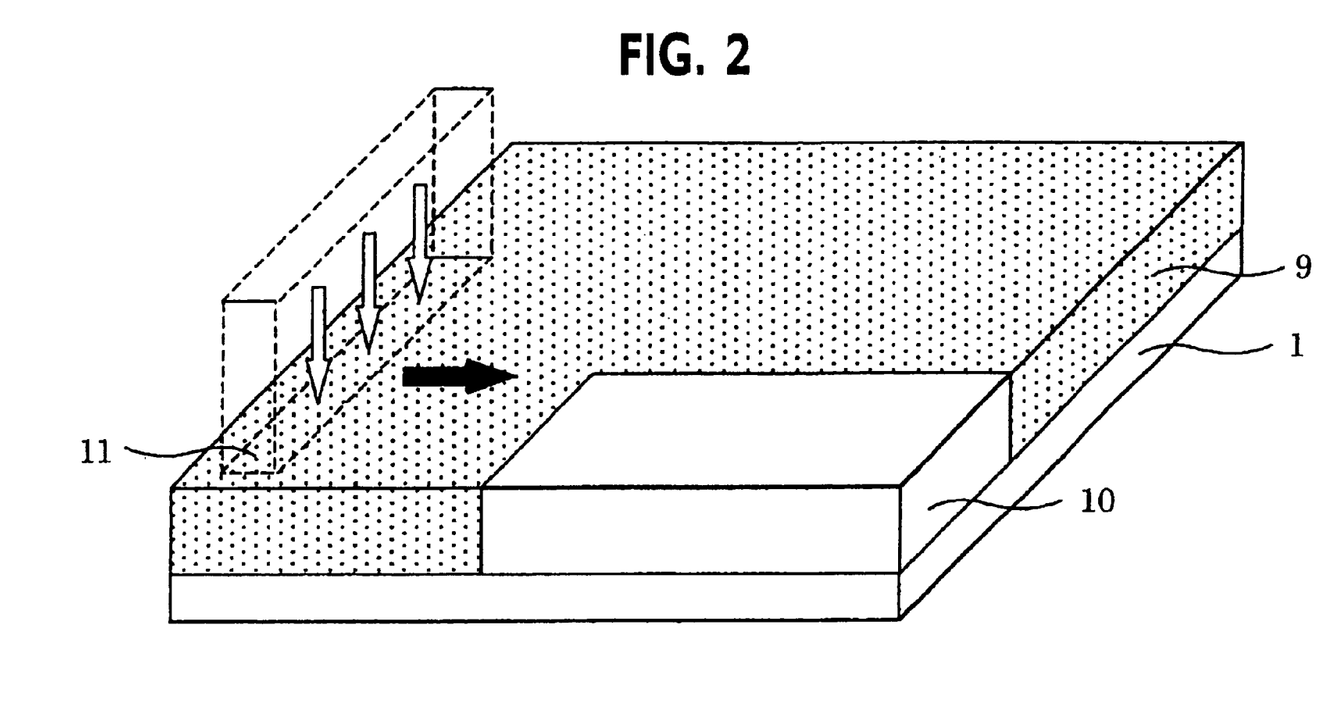
FIG. 2 shows a view illustrating a thin film transistor device and a process for producing thereof relating to a second embodiment of the present invention.
Figure 3:
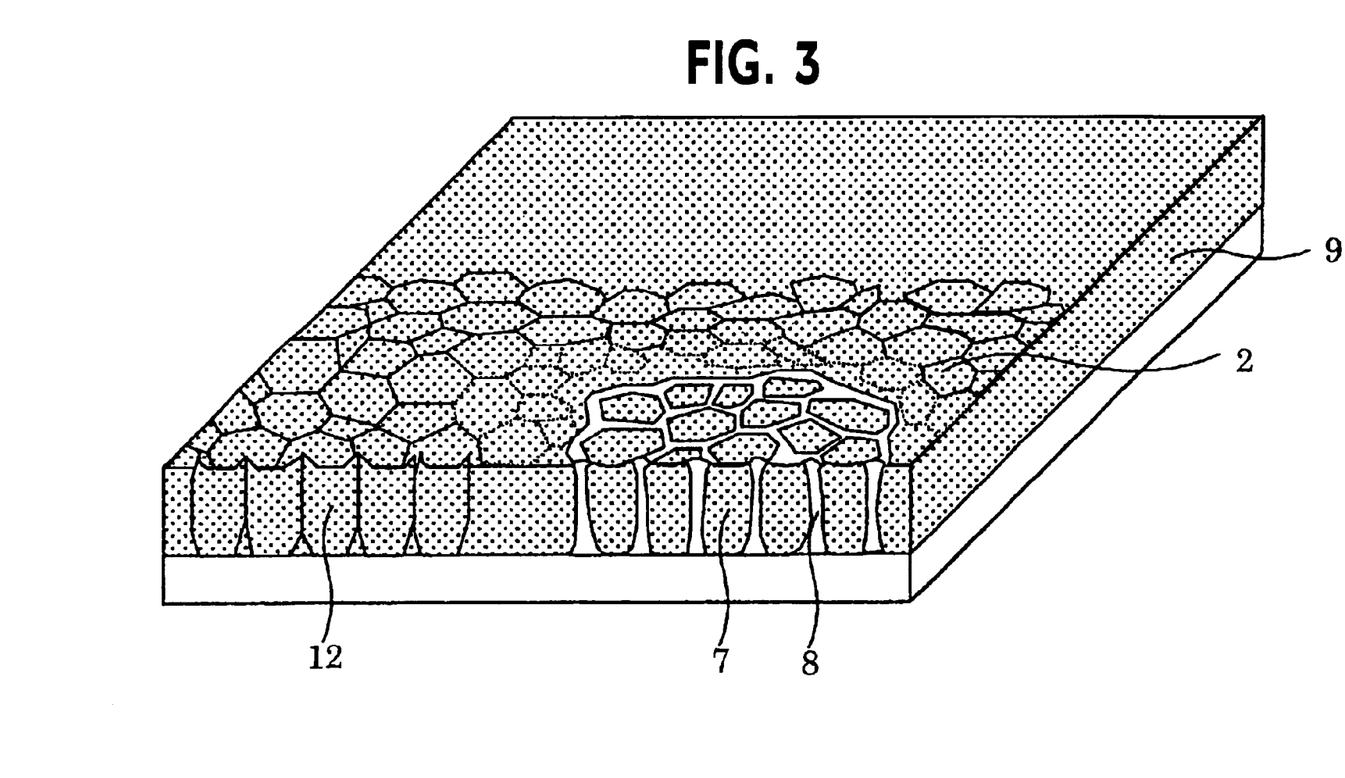
FIG. 3 shows a view illustrating a thin film transistor device and a process for producing thereof relating to a second embodiment of the present invention.
Figure 4:
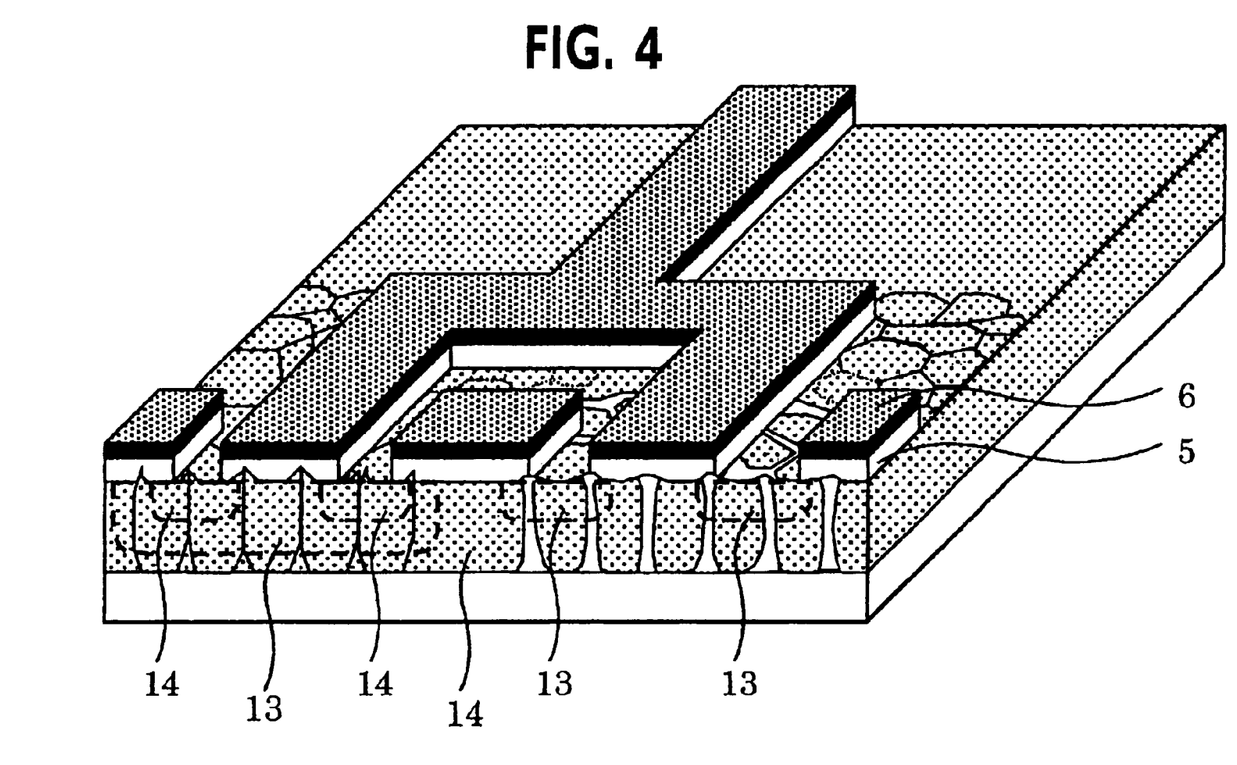
FIG. 4 shows a view illustrating a thin film transistor device and a process for producing thereof relating to a second embodiment of the present invention.

FIG. 2–FIG. 4 show views illustrating a thin film semi-conductor device and production process thereof relating to a second embodiment of the present invention. In the present embodiment, poly-crystalline $Si_{1-x}Ge_x$ thin films are partially introduced and a transistor is formed of a CMOS (complementary NOS) type.

Firstly, as illustrated in FIG. 2, an amorphous Si thin film 9 is formed on an insulator substrate (glass plate) 1. A part of the thin film 9 is formed by etching and removing using a photo process and is provided with an increased region 10 of a ratio of an embedded type Ge composition. A laser beam irradiation region 11 of the thus obtained thin film surface is scanned by sequentially moving a stage retaining the substrate 1 while conducting KrF excimer laser beam irradiation. At this time, by program controlling, in advance, a moving region of the stage, selectively crystallize only portions that will later be transistor regions.

With such a process, as illustrated in FIG. 3, pure Si poly-crystals 12 and poly-crystalline $Si_{1-x}Ge_x$ thin films 2 regions are formed only on required regions of the amorphous Si thin film 9.

Next, as illustrated in FIG. 4, n type regions 14 are formed by implanting As ions on an crystallized thin film, and p type regions 13 are formed by implanting B ions. Both of the regions are systematically and selectively formed by utilizing an implanting mask. Thereafter, furnace annealing is conducted in a nitrogen atmosphere at a temperature of 600° C. for approximately one hour, and the carriers of n-type regions 14 and in p type regions 13 are activated. The gate insulation films 5 and gates 6 are provided on the n type regions. 14 and the p type regions 13 to form transistors.

By so doing, there is an advantage that the CMOS type transistors in which low consumption power and high mobility being made compatible, are formed by respectively forming an n type transistor (composed of the poly-crystalline Si thin films 12 in the p type region 13), and p type transistors (composed of the poly-crystalline $Si_{1-x}Ge_x$ thin films 2 in the n type region 14).

Third Embodiment

Figure 5:
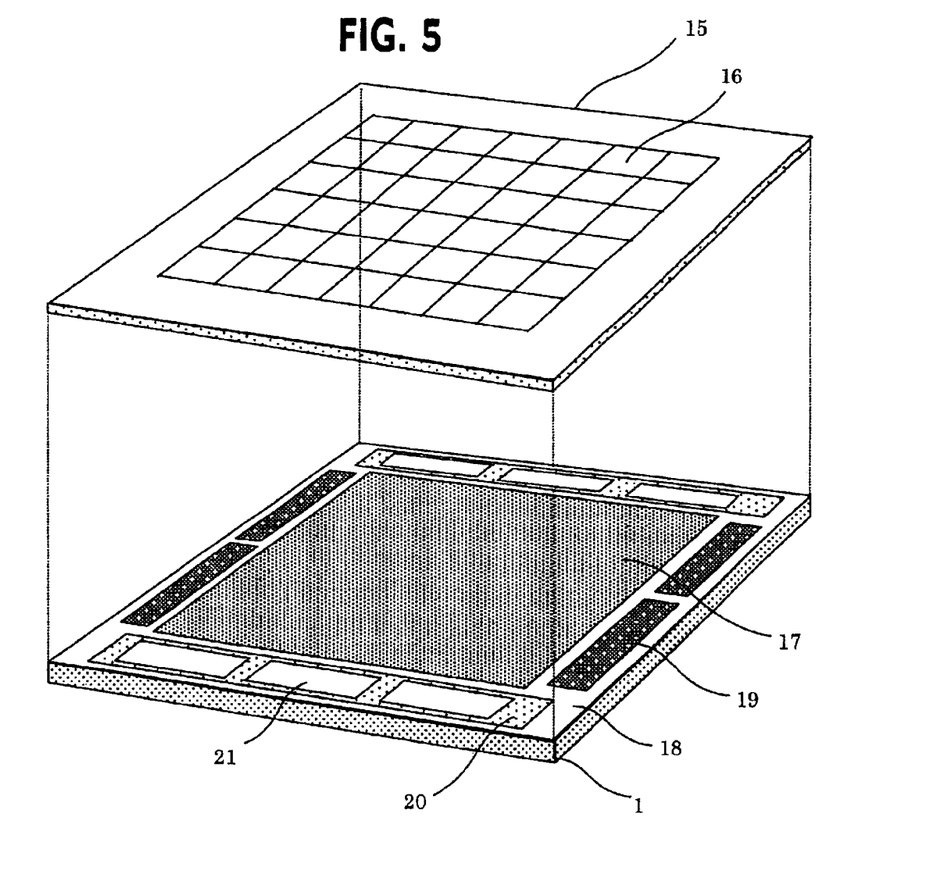
FIG. 5 shows a view illustrating an example of an image display device used with thin film transistor devices of the present invention.

FIG. 5 shows an example of an image display device used as a thin film semi-conductor device of the present invention. Poly-crystalline Si thin films and poly-crystalline $Si_{1-x}Ge_x$ thin films are selectively formed on an insulator substrate (glass plate) 1. Circuits composed of a pixel driver region 17, a buffer amplifier region 18, gate driver regions 19, shift resister regions 20, gate driver regions 21 and the like are integrated on the poly-crystalline Si thin films and the poly-crystalline $Si_{1-x}Ge_x$ thin films. These are integrally formed and are connected to an image display panel 15 having pixels 16.

Since the required performances to transistors constituting these circuits are respectively different from each other, the first to third embodiments of the present invention are selectively and complexedly combined with one another and utilized. With such a constitution, the main circuit can be integrated on the glass substrate of a large area, and an image display device integrating most of the conventional peripheral circuits can be formed. As such, the image display device can be produced with few processes utilizing the low cost glass substrates.

What is claimed is:

1. A method for producing a thin film transistor device comprising steps of:
   (a) forming an amorphous $Si_{1-x}Ge_x$ layer of a film thickness of 10–100 nm on an insulator substrate in which a Ge concentration x is 0<x<1; and
   (b) being subjected to a heat treatment for crystallizing the amorphous $Si_{1-x}Ge_x$ layer by an excimer laser with an energy density of 200–300 mJ/cm$^2$ and the pulse number of 1–50 by which the amorphous $Si_{1-x}Ge_x$ layer turns to a silicone-germanium poly-crystalline $Si_{1-x}Ge_x$ in which a Ge concentration x is 0<x<1, and a Ge concentration x in the poly-crystalline thin film is larger in a grain boundary than a portion where a Ge concentration in an interior crystal grain of the poly-crystalline thin film becomes a minimum value.

2. A method for producing a thin film transistor device as set forth in claim 1, wherein said step of heat treatment varies with the energy density as (180+T)~(200+T) mJ/cm$^2$ according to a film thickness when the film thickness of said amorphous $Si_{1-x}Ge_x$ layer is set as T nm.

3. A method for producing a thin film transistor device according to claim 2, wherein the Ge concentration x in the interior crystal grain of the poly-crystalline thin film is 0<x<0.1 and the Ge concentration x in the grain boundary of the poly-crystalline thin film is 0.3≦x<1.

4. A method for producing a thin film transistor device according to claim 1, wherein the Ge concentration x in the interior crystal grain of the poly-crystalline thin film is 0<x≦1.

5. A method of forming a transistor device comprising:
   (a) forming an amorphous $Si_{1-x}Ge_x$ layer having a thickness of 10–100 nm on an insulator substrate in which a Ge concentration x is 0<x<1; and
   (b) heat treating the amorphous $Si_{1-x}Ge_x$ layer using an excimer laser with an energy density of 200–300 mJ/cm$^2$ and a pulse number of 1–50 by which the amorphous $Si_{1-x}Ge_x$ layer turns to a silicone-germanium poly-crystalline $Si_{1-x}Ge_x$ in which a Ge concentration x is 0<x<1, and a Ge concentration x in the poly-crystalline thin film is larger in a grain boundary than a portion where a Ge concentration in an interior crystal grain of the poly-crystalline thin film becomes a minimum value.

6. A method of forming a transistor device as set forth in claim 5, wherein said heat treatment varies with the energy density as (180+T)~(200+T) mJ/cm$^2$ according to a film thickness when the film thickness of said amorphous $Si_{1-x}Ge_x$ layer is set as T nm.

7. A method of forming a transistor device as set forth in claim 5, wherein the Ge concentration x in the interior crystal grain of the poly-crystalline is 0<x≦1.

8. A method of forming a transistor device as set forth in claim 5, wherein the Ge concentration x in the interior crystal grain of the poly-crystalline thin film is 0<x≦0.1 and the Ge concentration x in the grain boundary of the poly-crystalline thin film is 0.3≦x<1.

* * * * *